US012730943B1

(12) United States Patent
Kim et al.

(10) Patent No.: US 12,730,943 B1
(45) Date of Patent: Sep. 8, 2026

(54) SIMULATION APPARATUS FOR CONFIRMING OPTIMIZED INSTALLATION POSITION OF DETECTOR OF CHEMICAL SUBSTANCE PLANT

(71) Applicant: HERSS Co., Ltd., Guri-si (KR)

(72) Inventors: Hyoung Seok Kim, Guri-si (KR); Hyun Joo Lee, Guri-si (KR)

(73) Assignee: HERSS CO., LTD., Guri-si (KR)

( * ) Notice: Subject to any disclaimer, the term of this patent is extended or adjusted under 35 U.S.C. 154(b) by 0 days.

(21) Appl. No.: 19/438,154

(22) Filed: Dec. 31, 2025

(30) Foreign Application Priority Data

Nov. 13, 2025 (KR) ........................ 10-2025-0171079

(51) Int. Cl.
*G06F 30/13* (2020.01)

(52) U.S. Cl.
CPC .................................... *G06F 30/13* (2020.01)

(58) Field of Classification Search
CPC ........................................................ G06F 30/13
USPC ......................................................... 715/810
See application file for complete search history.

(56) References Cited

U.S. PATENT DOCUMENTS

2012/0209574 A1* 8/2012 Moreau ................. G06F 3/0482 703/1
2013/0070856 A1* 3/2013 Sato ..................... H04N 19/513 375/E7.125
2013/0103362 A1* 4/2013 Mather ................ A62C 3/0271 703/1
2014/0095122 A1* 4/2014 Appleman ............ G06T 19/003 703/1
2015/0012171 A1* 1/2015 Richter ................... G06T 7/001 701/32.9
2019/0138667 A1* 5/2019 Benesh .................. G06Q 50/08
2019/0171780 A1* 6/2019 Santarone .......... G02B 27/0093
2020/0065433 A1* 2/2020 Duff .......................... G01S 5/02
2022/0156433 A1* 5/2022 Laane .............. G05B 19/41885
2022/0318441 A1* 10/2022 Jagannathan .......... G06V 10/60
2022/0335799 A1* 10/2022 P ............................ G08B 17/00
2022/0382929 A1* 12/2022 Santarone ............ G06T 19/006
2023/0169222 A1* 6/2023 Wang ...................... G06F 30/20 703/1
2023/0169224 A1* 6/2023 Ramanasankaran .... G06F 30/13 703/1

(Continued)

FOREIGN PATENT DOCUMENTS

KR 10-1692926 A 7/2016
KR 10-1926368 B1 12/2018

*Primary Examiner* — William D Titcomb
(74) *Attorney, Agent, or Firm* — Scully, Scott, Murphy & Presser, P.C.

(57) ABSTRACT

A simulation apparatus for confirming an optimized installation position of a detector of a chemical substance plant, which is capable of confirming the optimal installation position of a detector while directly displaying chemical substances stored in the chemical substance plant, a leakage source, and positions of detectors. The simulation apparatus for confirming an optimized installation position of a detector of a chemical substance plant according to the present invention includes a screen manager, a process manager, a detailed setting manager, an image display screen manager, a link manager, a 3D plant image manager, a chemical substance selection manager, a leakage source designation manager, a candidate detector installation manager, and a detector optimization manager.

17 Claims, 14 Drawing Sheets

(56) References Cited

U.S. PATENT DOCUMENTS

| | | | | |
|---|---|---|---|---|
| 2023/0195955 | A1* | 6/2023 | Wittenborn | G06T 19/20 703/1 |
| 2023/0342511 | A1* | 10/2023 | Wodrich | G06T 19/006 |
| 2024/0192649 | A1* | 6/2024 | Gomez-Martinez | G06Q 10/063 |
| 2024/0411944 | A1* | 12/2024 | Reinhart | G06F 30/13 |
| 2026/0004516 | A1* | 1/2026 | Ye | G06T 17/00 |
| 2026/0017421 | A1* | 1/2026 | Hoernicke | G06F 30/13 |

* cited by examiner

SIMULATION APPARATUS FOR CONFIRMING OPTIMIZED INSTALLATION POSITION OF DETECTOR OF CHEMICAL SUBSTANCE PLANT

CROSS REFERENCE TO RELATED APPLICATION

The present application claims priority to Korean Patent Application No. 10-2025-0171079, filed Nov. 13, 2025, the entire contents of which are hereby incorporated by reference in its entirety.

BACKGROUND

Field

The present invention relates to a simulation apparatus for confirming an optimized installation position of a detector of a chemical substance plant, which is capable of confirming the optimal installation position of a detector while directly displaying chemical substances stored in the chemical substance plant, a leakage source, and positions of detectors.

Description of the Related Art

In general, during the process of operating industrial facilities such as chemical plants, manufacturing plants, and steel plants, it may be inevitable to use chemical substances.

Such chemical substances, which may include various harmful, dangerous, etc., elements that could cause fires, explosions, toxicity, etc., are used upon transfer through pipes after being stored in storage containers, etc, such as tanks arranged at independent locations.

However, when chemical substances are leaked to the outside from storage containers such as tanks or from facilities, the harmfulness and danger possessed by the chemical substances may cause social problems such as human casualties, environmental pollution, large-scale property loss, and harm to nearby residents, and may also lead to serious large-scale accidents.

For this reason, industrial facilities have adopted and utilized hazardous chemical substance management systems and detection systems that safely manage chemical substances and perform rapid detection thereof, thereby improving safety and stability.

According to the chemical substance management laws, measures to prevent leakage or outflow of hazardous chemical substances and the like are prescribed, and in particular, when an abnormality occurs in facilities handling hazardous chemical substances, necessary alarm devices shall be installed so that a worker may easily recognize the abnormality, and in the case where it is difficult to install such alarm devices, it is prescribed that a monitoring person or CCTV shall be installed, and when chemical substances are leaked to the outside, it is prescribed to be equipped with facilities capable of detection and providing alarms.

This is because, in order to minimize damage caused by the leakage of chemical substances, above all, it is important to detect any leakage at an early stage. Accordingly, it is necessary to predict all locations where the possibility of leakage of chemical substances is high, to predict the degree of evaporation and diffusion in each scenario, and to install detectors through optimization of installation positions of chemical substance leakage detection alarm devices, so that there are no blind spots of detection.

Meanwhile, in relation to chemical substance leakage detection systems, Korean Registered Patent No. 10-1692926 and Korean Registered Patent No. 10-1926368 propose and disclose chemical substance leakage detection systems, but propose hazardous chemical substance leakage detection systems for detecting and responding to hazardous chemical substances leaked from moving bodies transporting hazardous chemical substances.

SUMMARY

An object to be solved by the present invention is to provide a simulation apparatus for confirming an optimized installation position of a detector(s) at a chemical substance plant, which is capable of confirming the optimal installation position of such detector(s) while directly displaying chemical substances stored in the chemical substance plant, a leakage source, and positions of the detector(s).

There is provided a simulation apparatus for confirming an optimized installation position of a detector of a chemical substance plant, according to the present invention. The simulation apparatus may comprise: a screen manager (100) including: a process display screen (110) for displaying widgets used for simulation of a chemical substance plant to allow selection of the widgets by a user, displaying a widget selected by the user on a widget icon display screen (220), and displaying a link line when links are made between widgets displayed in a widget icon display area, a detailed setting display screen (120) for displaying a related menu of a selected widget when a widget icon in a widget icon display area of a process management region is selected, and a 3D plant image display screen (130) for displaying a 3D plant image selected through a 3D plant selection widget of a process manager (200); the process manager (200) configured to manage the process display screen (110), and including: a widget list display portion (210) for displaying a list of widgets including a 3D plant selection widget, a chemical substance selection widget, a leakage source designation widget, a candidate detector generation widget, and an optimization widget, and a widget icon display screen (220) for displaying, as an icon, a widget selected from the widget list display portion (210), and a widget icon display screen (220) for displaying, as an icon, a widget selected from the widget list display portion (210); a detailed setting manager (300) configured to manage the detailed setting display screen (120), and to display a related menu of a selected widget when a widget icon positioned on the widget icon display screen (220) of the process manager (200) is selected; an image display screen manager (400) configured to: manage a 3D plant image display screen (130), display an image of a 3D plant selected through a 3D plant selection widget, display a position of a leakage source selected through a leakage source designation widget, display a position of a detector candidate selected through a candidate detector generation widget, and display an image of a leakage scenario confirmed through an optimization widget; a link manager (500) configured to manage integration of information of connected widgets when widget icons displayed on the widget icon display screen (220) of the process manager (200) are linked; a 3D plant image manager (600) configured to: when a 3D plant selection widget icon (610) displayed on the widget icon display screen (220) of the process manager (200) is selected, display a related menu of the 3D plant selection widget on the detailed setting manager (300), when a 3D plant file is selected through a file loading item (620) among the related menu, display a selected 3D plant image in a separate rescaling window (630), and, when selection of the 3D plant image displayed in the rescaling window (630) is completed, display the selected 3D plant image on the 3D plant image display screen (130) of the 3D plant image manager (600); a chemical substance selection manager (700) configured to: when a chemical substance selection widget icon (710) displayed on the widget icon display screen (220) of the process manager (200) is selected, display a related menu of the chemical substance selection widget on the detailed setting manager (300), and when a registered chemical substance is selected through a search menu of a physical property value item (720) among the related menu, store and manage physical property information of the selected chemical substance; a leakage source designation manager (800) configured to: when a leakage source designation widget icon (810) displayed on the widget icon display screen (220) of the process manager (200) is selected, display a related menu of the leakage source designation widget on the detailed setting manager (300), and when a 3D plant image displayed on the 3D plant image display screen (130) of the 3D plant image manager (600) is clicked with a mouse, display a leakage source mark (820) at a clicked point, and input, into a leakage source coordinate item (830) of the related menu, a coordinate corresponding to the leakage source mark (820); a candidate detector installation manager (900) configured to: when a candidate detector generation widget icon (910) displayed on the widget icon display screen (220) of the process manager (200) is selected, display a related menu of the candidate detector generation widget on the detailed setting manager (300), and when a 3D plant image displayed on the 3D plant image display screen (130) of the 3D plant image manager (600) is clicked with a mouse, display a candidate detector at a clicked point, and input, into a candidate detector coordinate item (920) of the related menu, a coordinate of the generated candidate detector; and a detector optimization manager (1000) configured to: when an optimization executing widget icon (1010) displayed on the widget icon display screen (220) of the process manager (200) is selected and displayed, display a related menu of the optimization executing widget on the detailed setting manager (300), execute optimization of a detector so as to correspond an item selected from the related menu, and display, on a 3D plant image displayed on the 3D plant image display screen (130) of the 3D plant image manager (600), an optimal-position detector and an image of leakage of a chemical substance leaked from a leakage source.

Preferably, the process manager (200), when a widget displayed on the widget list display portion (210) is selected by a mouse and then dragged to the widget icon display screen (220), may display a widget icon (230) on the widget icon display screen (220), and the widget icon (230) displayed on the widget icon display screen (220) may be movable in upward, downward, leftward, and rightward directions by using the mouse.

Preferably, widget link connection portions (231), capable of linking other widget icons, may be formed at upper, lower, left, and right sides of the widget icon (230).

Preferably, a widget related menu displayed on the detailed setting manager (300) may be configured such that, when the widget is a 3D plant selection widget, a file loading item (620) is provided; when the widget is a chemical substance selection widget, a physical property value item (720) is provided; when the widget is a leakage source designation widget, a leakage source coordinate item (830), a leakage rate item (840), and a leakage rate batch-application item (850) are provided; when the widget is a candidate detector generation widget, a candidate detector coordinate item (920), a batch generation item (940), and a candidate detector hiding item (950) are provided; and when the widget is an optimization executing widget, an optimization executing item (1020), an animation executing item (1030), a detector/gas cloud visualization selection item (1040), a scenario selection item (1050), and a detector coordinate-detection scenario display item (1060) are provided.

Preferably, the link manager (500), when a widget icon is connected to another widget icon while the widget icon is clicked by a mouse, may form a link line (510) between the widget icons.

Preferably, the rescaling window (630) may convert the 3D plant image displayed through loading to be suitable for a standard displayed on the 3D plant image display screen (130), and the rescaling window (630) may include: a 3D image display screen on which a 3D plant image is displayed; a rotation menu for rotating a 3D image in X, Y, and Z directions; a scale change menu for changing a scale of the 3D image; and a completion menu for applying the 3D image displayed on the 3D image display screen to be displayed on the 3D plant image display screen (130).

Preferably, the leakage source designation manager (800) may receive, as input, from a user, an applied leakage rate of a leakage rate item (840) matched with a leakage source coordinate, or, when a leakage rate batch-application item is selected, may display a leakage rate calculated from a leakage amount calculation window (860) displayed.

Preferably, the leakage amount calculation window (860) may display leakage type selection items (861) for container leakage and pipe leakage, material-phase selection items (862) including gas and liquid, etc., unit selection items (863) including MKS and FPS, and parameter input items (864) including operating pressure, operating temperature, atmospheric pressure around a discharge port, diameter, discharge coefficient, specific heat ratio, molecular weight, and the like which are input by a user, and in which a leakage rate may automatically calculated when each item is input.

Preferably, the candidate detector installation manager (900), when a uniform generation item (930) of a related menu is selected and spacing information of X, Y, and Z coordinates is input, and then a batch generation item (940) is selected, may automatically generate candidate detector coordinates at uniform intervals.

Preferably, optimization of a detector installation position of the detector optimization manager (1000) may be basically performed by using a turbulence flow, based on a movement path and a distribution map of a chemical substance diffused after leakage, using physical property information of the chemical substance selected from the chemical substance selection manager (700) and input items of a leakage amount calculation window (860) of the leakage source designation manager (800), and a large eddy simulation (LES) technique may be employed.

Preferably, a related menu of an optimization executing widget of the detector optimization manager (1000) may include an optimization executing item (1020), an animation executing item (1030), a detector/gas cloud visualization selection item (1040), a scenario selection item (1050), and a detector coordinate-detection scenario display item (1060) in which a scenario of a chemical substance detected by a detector is matched with detector coordinates, and when the optimization executing item (1020) is selected, optimization of a detector applied to a 3D plant is executed, among candidate detectors selected from the candidate detector installation manager (900), a detector may be calculated and selected, and the selected detector may be displayed on a 3D plant image; when an animation executing item (1030) is selected, a flow in which a chemical substance is leaked and diffused may be displayed as an image on the 3D plant image on which the optimized detector is displayed; when a detector is selected in a detector/gas cloud visualization selection item (1040), the detector may be displayed on the 3D plant image, and when the detector is not selected, the detector may not be displayed on the 3D plant image; when a gas cloud is selected, an image of leakage of a chemical substance may be displayed on the 3D plant image, and when the gas cloud is not selected, the image of leakage of a chemical substance may not be displayed on the 3D plant image; when a scenario applied to a detector is selected in the scenario selection item (1050), an image of leakage of a chemical substance applied to the detector may be displayed on the 3D plant image, and when the scenario is not selected, the image of leakage of a chemical substance applied to the detector may not be displayed on the 3D plant image; and when a detector coordinate is selected in the detector coordinate-detection scenario display item (1060), a scenario image of a chemical substance matched with the selected detector coordinate may be displayed in different colors on the 3D plant image.

The simulation apparatus for confirming an optimized installation position of a detector of a chemical substance plant of the present invention has an effect that, while displaying a chemical substance plant image, a user may directly set a leakage source and a candidate detector position, and may confirm an optimal installation position of a detector.

In addition, there is an advantage that the leakage rate of the leakage source may be calculated by providing leakage type selection items for container leakage and pipe leakage, material-phase selection items including gas and liquid, etc., unit selection items including MKS and FPS, and parameter input items including operating pressure, operating temperature, atmospheric pressure around a discharge port, diameter, discharge coefficient, specific heat ratio, molecular weight, and the like so that conditions suitable for the chemical substance plant may be simply set, and the leakage rate may be calculated easily by simple use.

DETAILED DESCRIPTION

Figure 1:
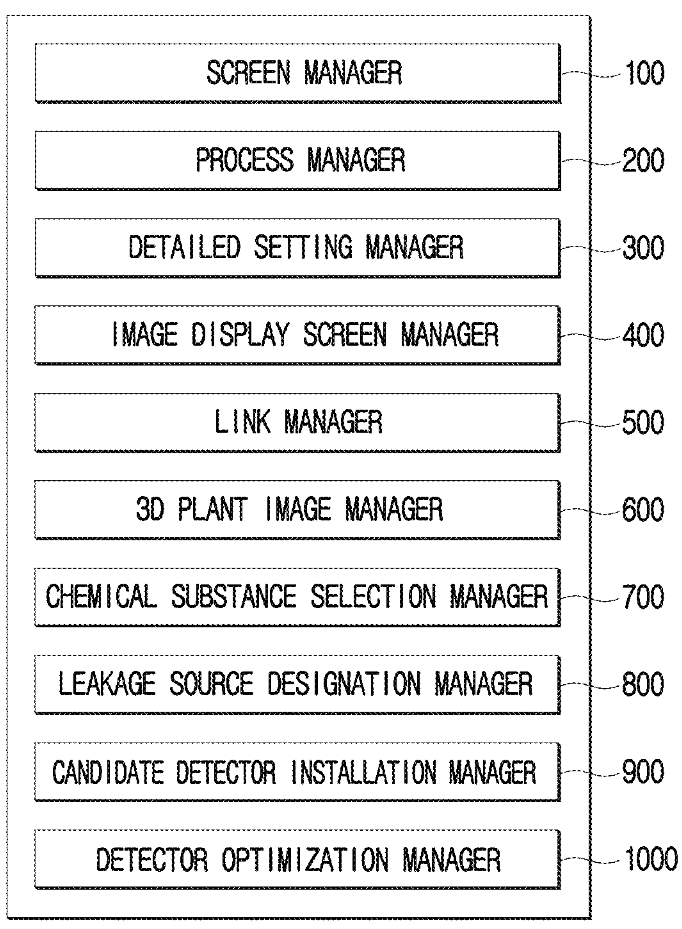
FIG. 1 is a block diagram of a detector arrangement design apparatus of a chemical substance plant according to the present invention.
Figure 2:
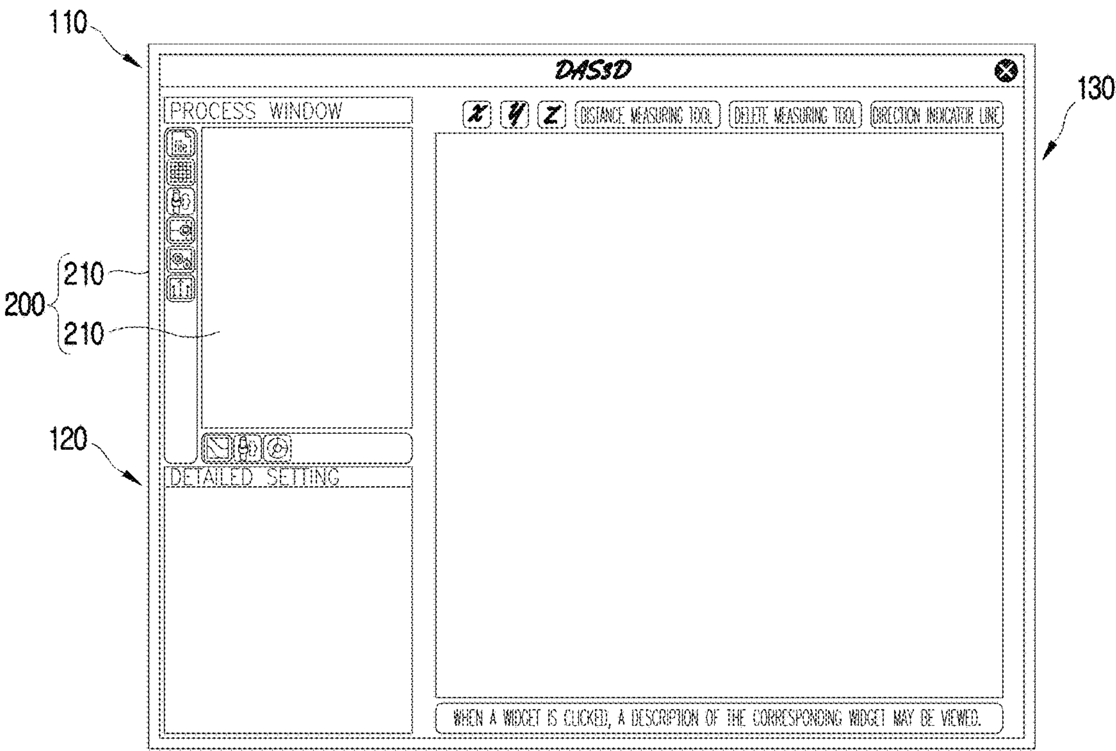
FIG. 2 is an exemplary view of a screen manager 100 according to the present invention.
Figure 3:
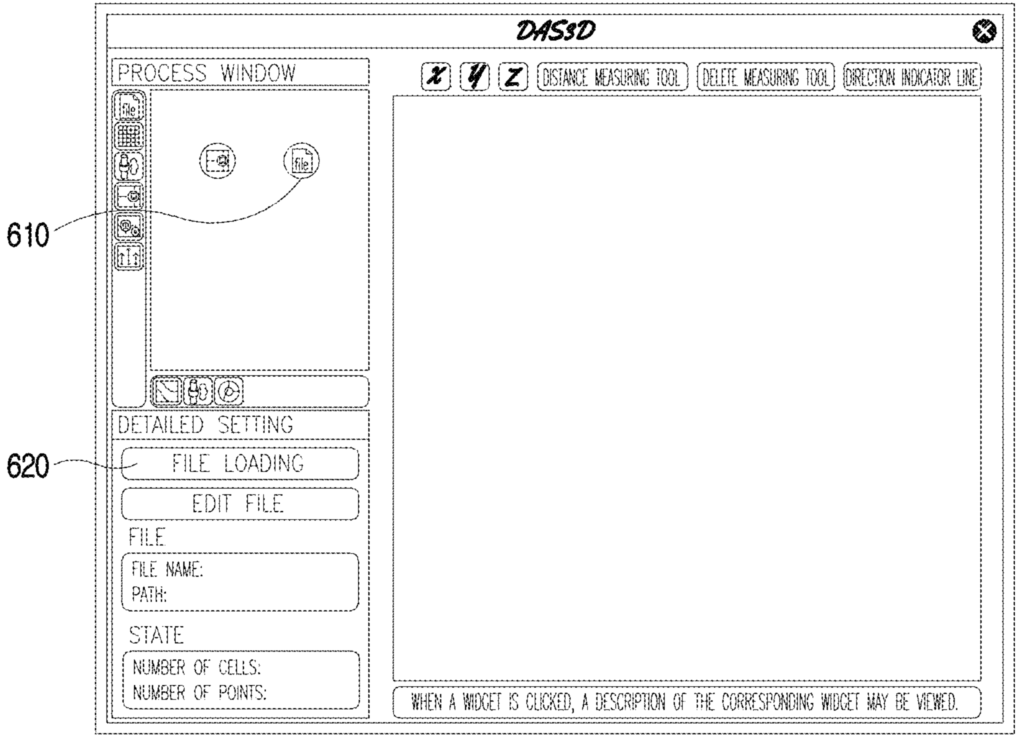
FIG. 3 is an exemplary view in which, by a 3D plant image manager 600 according to the present invention, a 3D plant selection widget icon 610 is displayed on a widget icon display screen 220, and a related menu is displayed on a detailed setting display screen 120.
Figure 4:
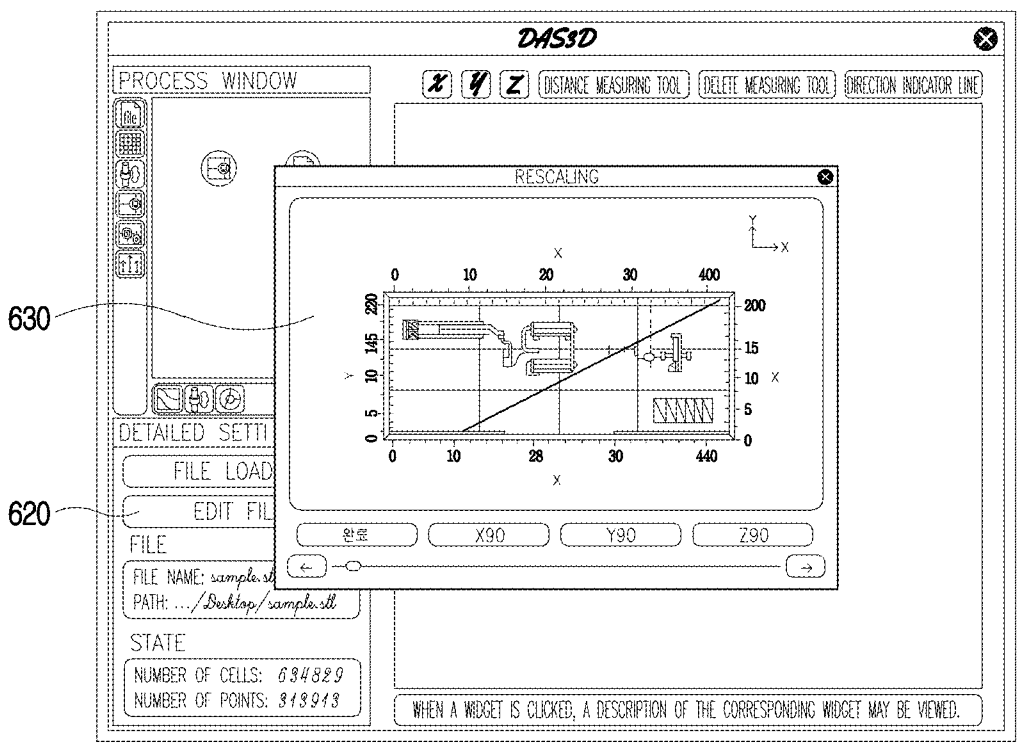
FIG. 4 is an exemplary view in which, when a 3D plant file is selected by a 3D plant image manager 600 according to the present invention, a selected 3D plant image is displayed on a rescaling window 630.
Figure 5:
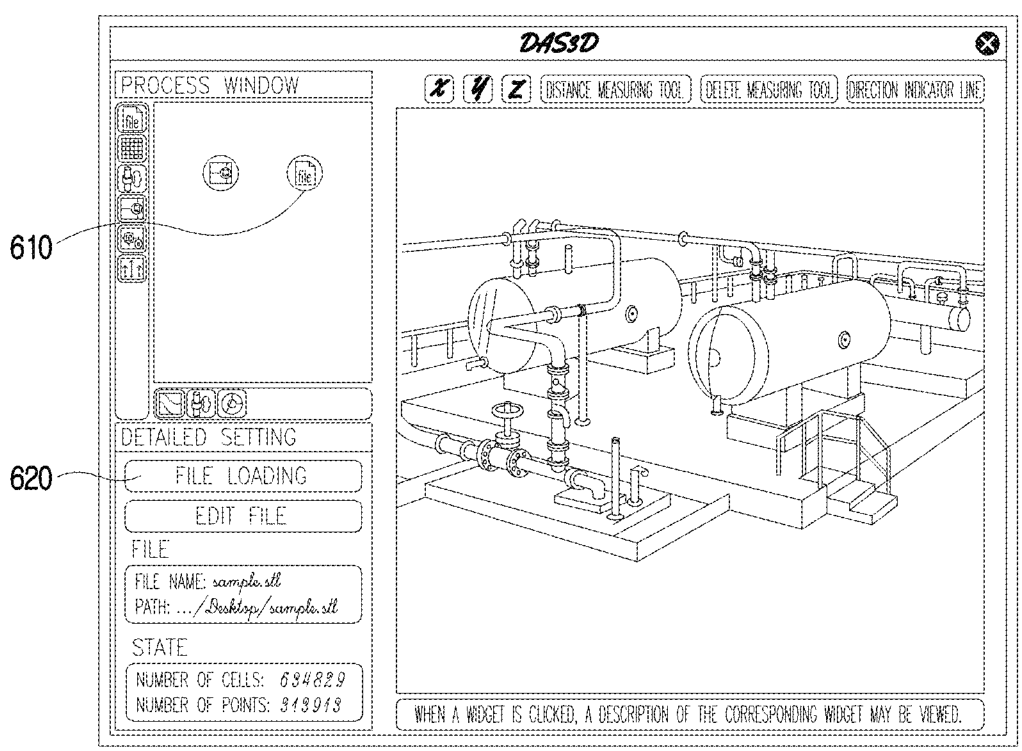
FIG. 5 is an exemplary view in which a 3D plant image is displayed on a rescaling window 630 by a 3D plant image manager 600 according to the present invention.
Figure 6:
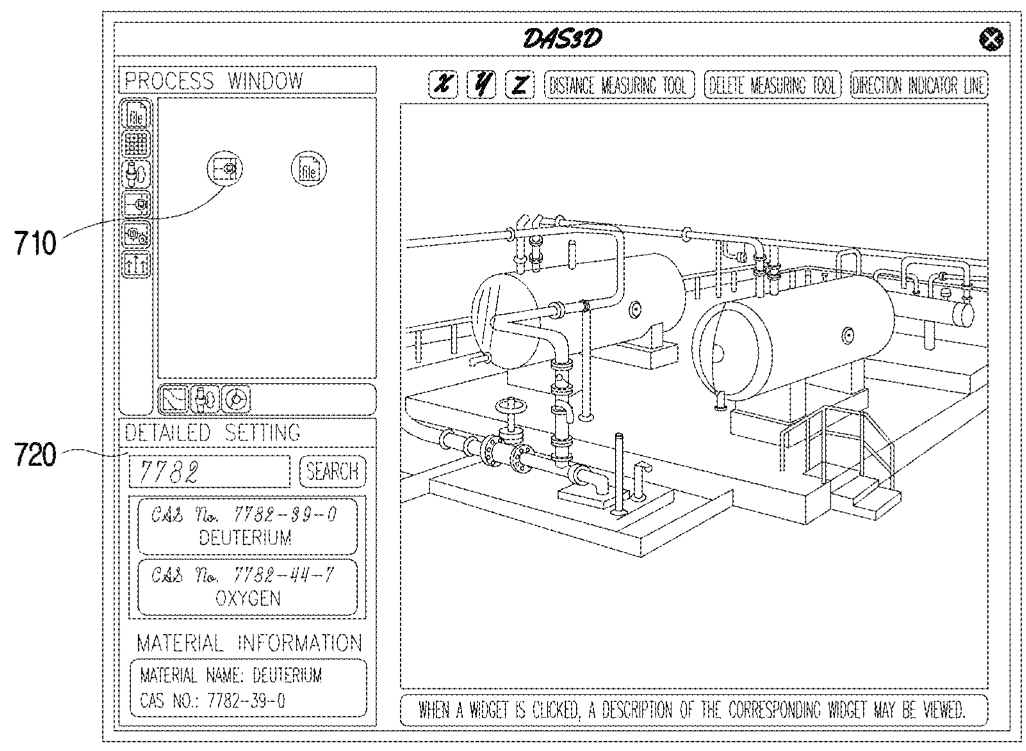
FIG. 6 is an exemplary view in which, by a chemical substance selection manager 700 according to the present invention, a chemical substance selection widget icon 710 is displayed on a widget icon display screen 220, and a related menu is displayed on a detailed setting display screen 120.
Figure 7:
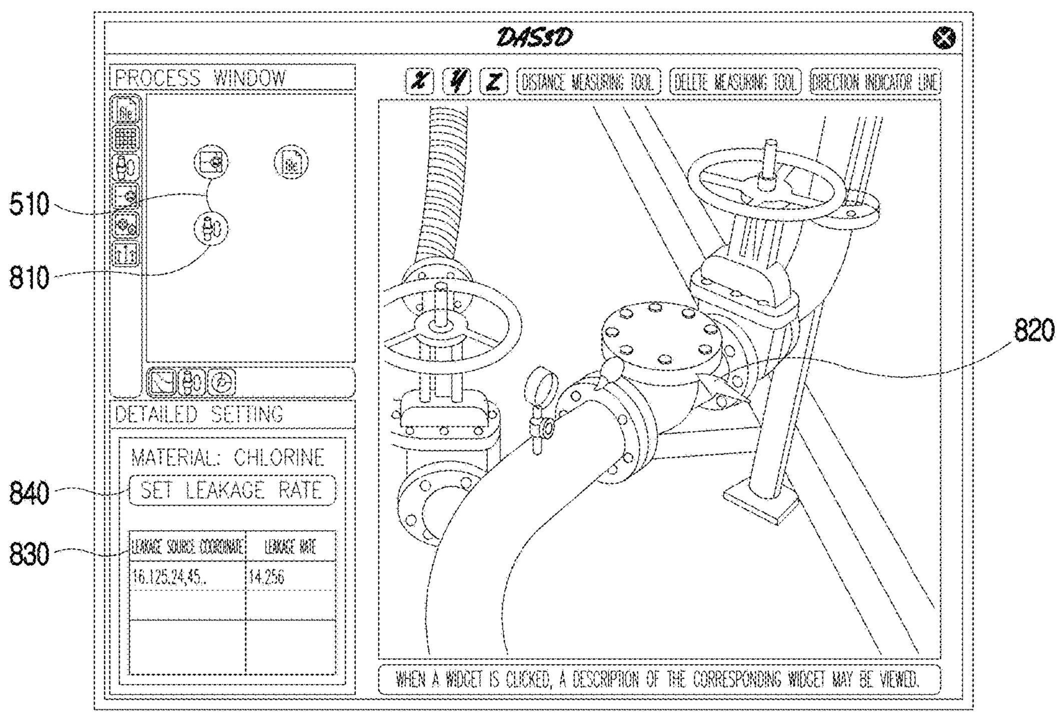
FIG. 7 is an exemplary view in which, by a leakage source designation manager 800 according to the present invention, a leakage source designation widget icon 810 is displayed on a widget icon display screen 220, a related menu is displayed on a detailed setting display screen 120, and a leakage source mark 820 is displayed on a 3D plant image of a 3D plant image display screen 130.
Figure 8:
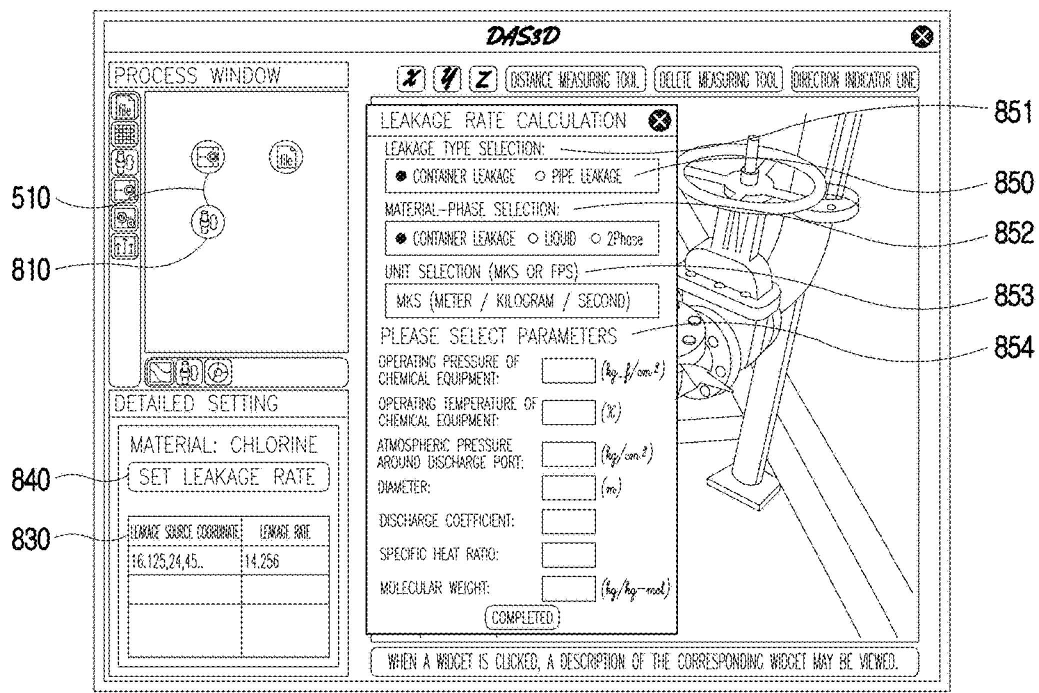
FIG. 8 is an exemplary view in which, when a leakage rate batch-application item 850 of a detailed setting display screen 120 is selected by a leakage source designation manager 800 according to the present invention, a leakage amount calculation window 860 is displayed.
Figure 9:
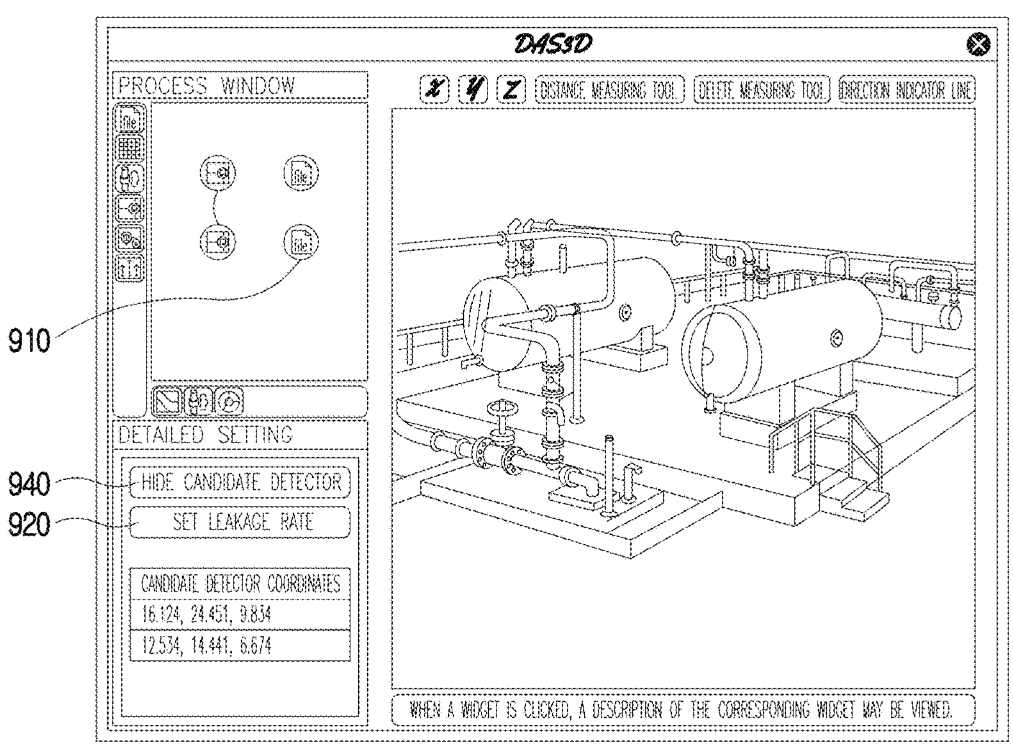
FIG. 9 is an exemplary view in which, by a candidate detector installation manager 900 according to the present invention, a candidate detector generation widget icon 910 is displayed on a widget icon display screen 220, a related menu is displayed on a detailed setting display screen 120, and when a candidate detector is displayed on a 3D plant image of a 3D plant image display screen 130, a coordinate of the candidate detector is displayed on a candidate detector coordinate item 920.
Figure 10:
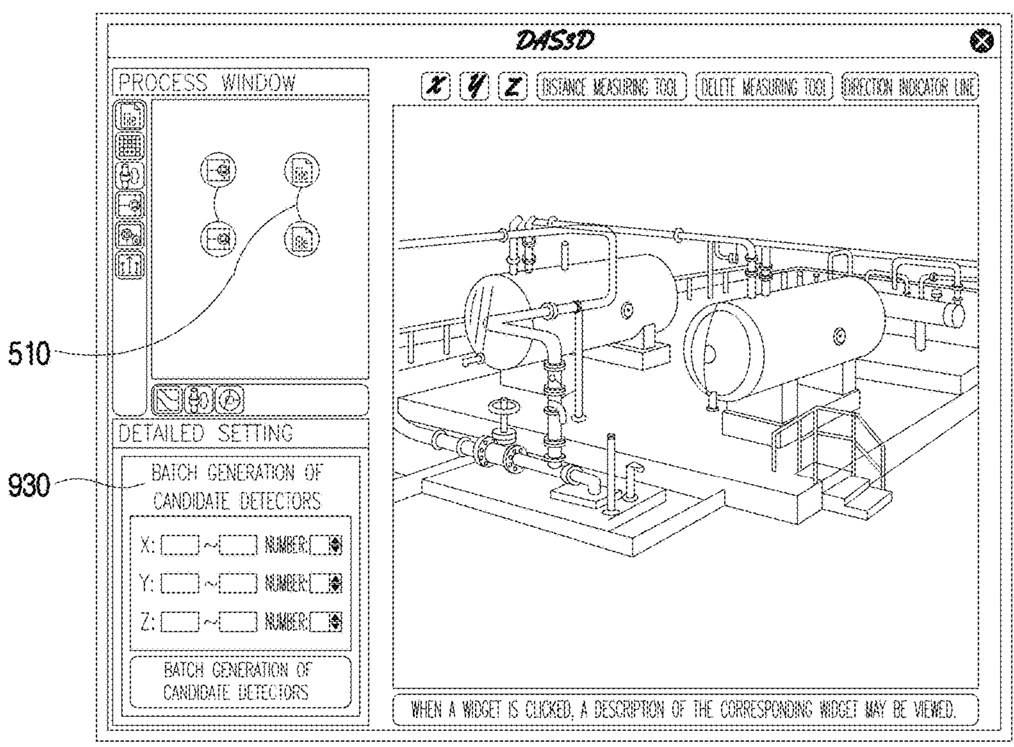
FIG. 10 is an exemplary view in which, when a batch generation item 940 of a detailed setting display screen 120 is input by a candidate detector installation manager 900 according to the present invention, candidate detector coordinates are generated at uniform intervals on a 3D plant image.
Figure 11:
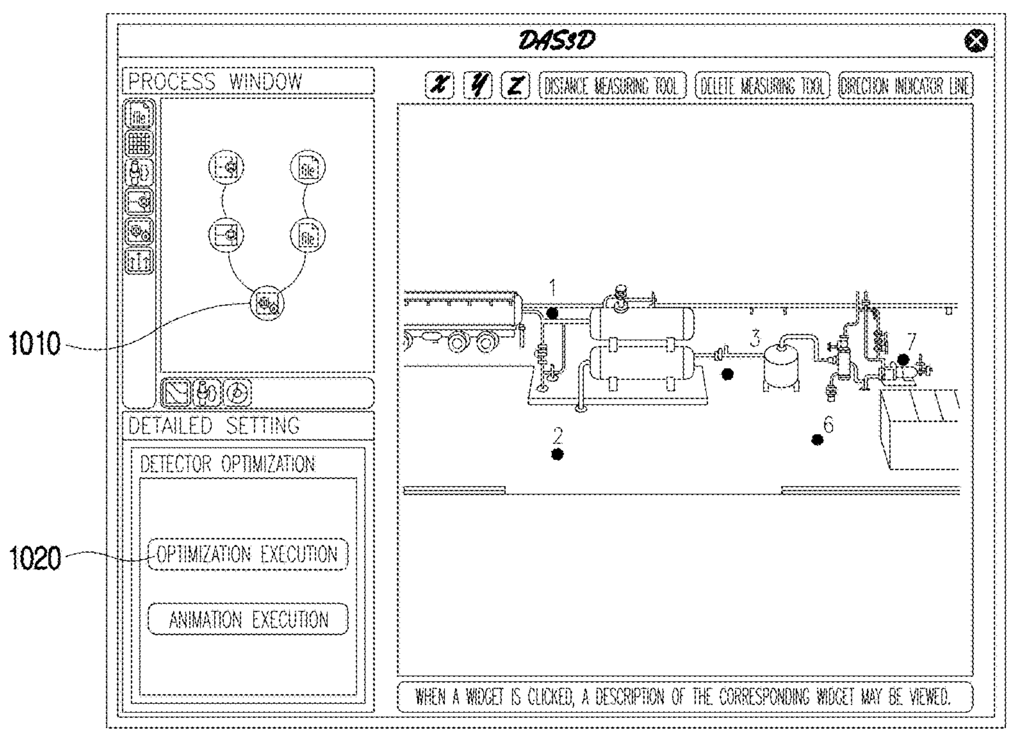
FIG. 11 is an exemplary view in which, by a detector optimization manager 1000 according to the present invention, an optimization executing widget icon 1010 is displayed on a widget icon display screen 220, a related menu is displayed on a detailed setting display screen 120, and an optimized detector is displayed on a 3D plant image of a 3D plant image display screen 130.
Figure 12:
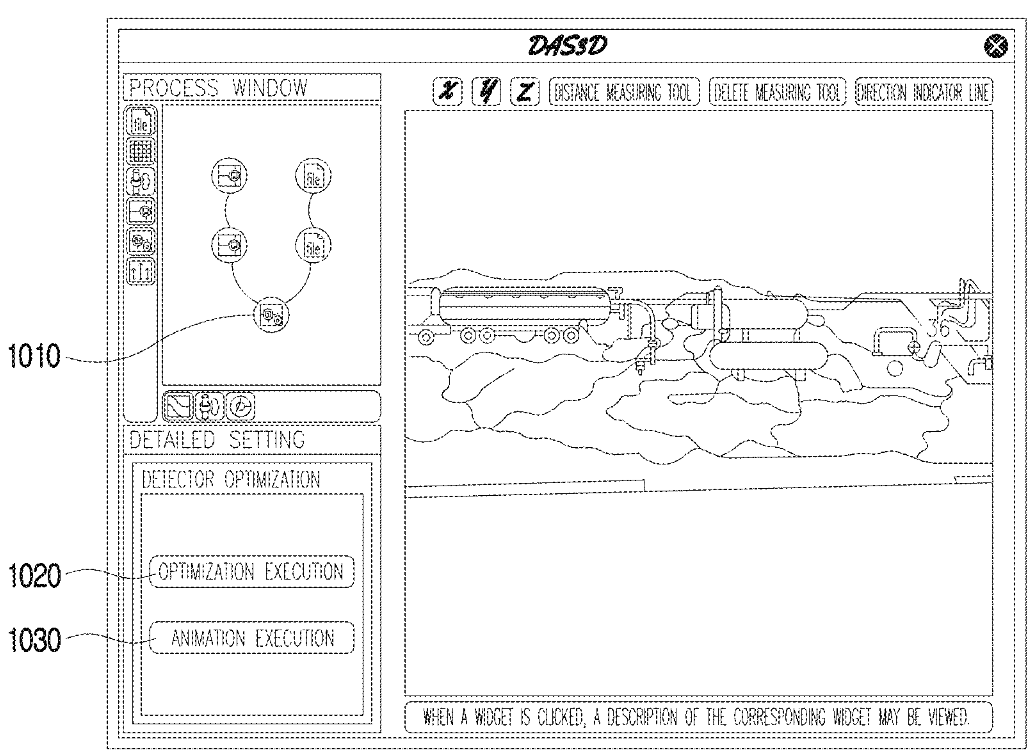
FIG. 12 is an exemplary view in which, when an animation executing item 1030 of a detailed setting display screen 120 is selected by a detector optimization manager 1000 according to the present invention, a flow of leaked chemical substance is displayed on a 3D plant image of a 3D plant image display screen 130.
Figure 13:
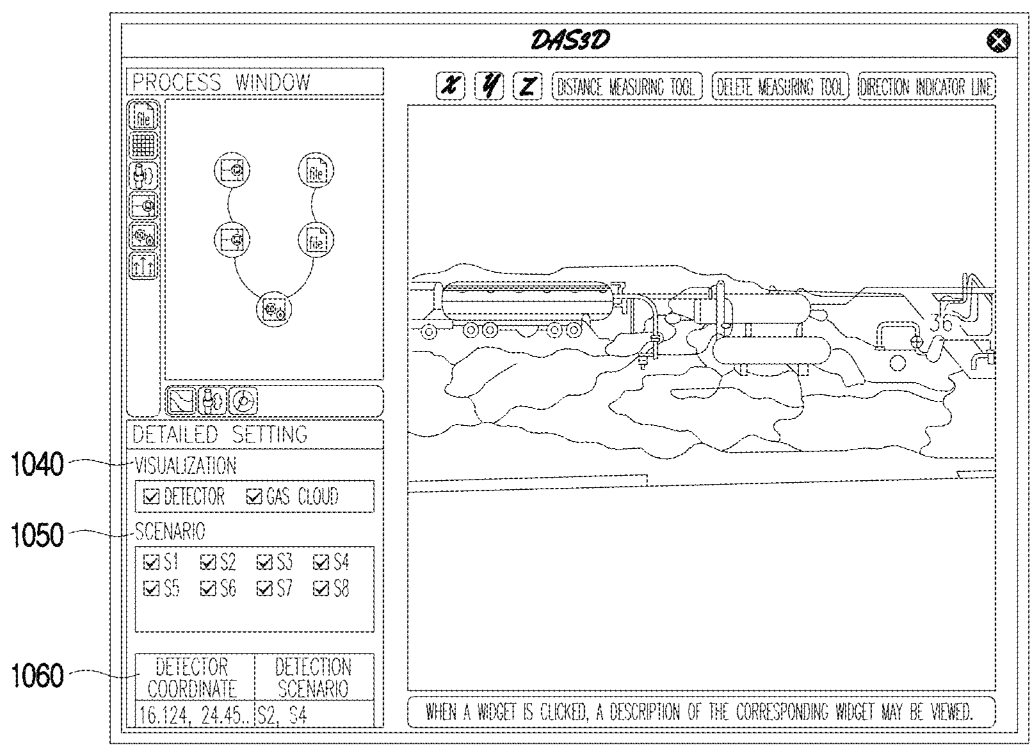
FIG. 13 is an exemplary view in which a detector/gas cloud visualization selection item 1040 of a detailed setting display screen 120 is selected by a detector optimization manager 1000 according to the present invention.
Figure 14:
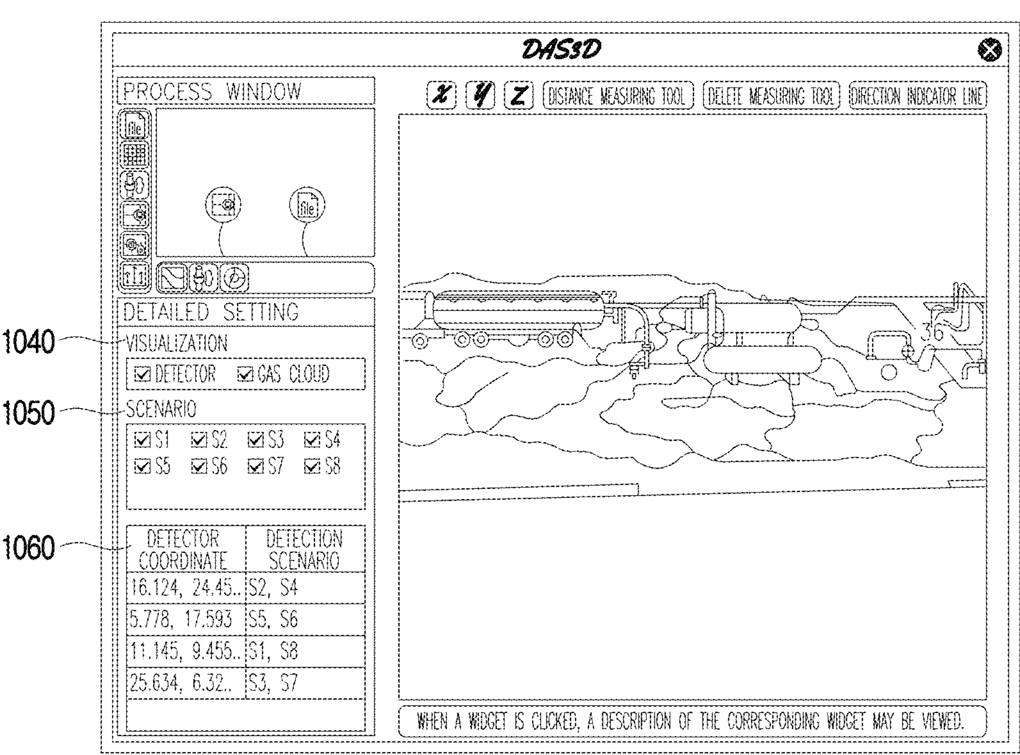
FIG. 14 is an exemplary view in which, when a detector coordinate-detection scenario display item 1060 of a detailed setting display screen 120 is selected by a detector optimization manager 1000 according to the present invention, scenario images of chemical substances matched with the selected detector coordinates are displayed in different colors.

Hereinafter, embodiments of the present invention will be described with reference to the accompanying drawings.

A simulation apparatus for confirming an optimized installation position of a detector of a chemical substance plant according to the present invention includes a screen manager 100, a process manager 200, a detailed setting manager 300, an image display screen manager 400, a link manager 500, a 3D plant image manager 600, a chemical substance selection manager 700, a leakage source designation manager 800, a candidate detector installation manager 900, and a detector optimization manager 1000.

The screen manager 100 displays widgets used for simulation of a chemical substance plant to allow a user to select a desired widget, displays a widget selected by the user on a widget icon display screen 220, and includes a process display screen 110 for displaying a link line when links are made between widgets displayed in a widget icon display area, a detailed setting display screen 120 in which, when a widget icon in the widget icon display area of the process management region is selected, a related menu of the selected widget is displayed, and a 3D plant image display screen 130 in which a 3D plant image selected through a 3D plant selection widget of the process manager 200 is displayed.

The process manager 200 manages the process display screen 110, and includes a widget list display portion 210 in which lists of 3D plant selection widget, chemical substance selection widget, leakage source designation widget, candidate detector generation widget, and optimization widget are displayed, and a widget icon display screen 220 that displays a widget icon corresponding to a widget selected from the widget list display portion 210. The process manager 200 causes a widget icon 230 to be displayed when a widget displayed on the widget list display portion 210 is selected by a mouse and then dragged to the widget icon display screen 220. The widget icon 230 displayed on the widget icon display screen 220 is preferably movable in upward, downward, leftward, and rightward directions by using the mouse. In addition, widget link connection portions 231 capable of linking other widget icons are formed at upper, lower, left, and right sides of the widget icon 230.

The detailed setting manager 300 manages the detailed setting display screen 120, and when a widget icon positioned on the widget icon display screen 220 of the process portion is selected, a related menu of the selected widget is displayed. The related menu of the widget is provided with a file loading item 620 in a case of a 3D plant selection widget, a physical property value item 720 in a case of a chemical substance selection widget, a leakage source coordinate item 830, a leakage rate item 840, and a leakage rate batch-application item 850 in a case of a leakage source designation widget, a candidate detector coordinate item 920, a batch generation item 940, and a candidate detector hiding item 950 in a case of a candidate detector generation widget, and an optimization executing item 1020, an animation executing item 1030, a detector/gas cloud visualization selection item 1040, a scenario selection item 1050, a detector coordinate-detection scenario display item 1060, and the like in a case of an optimization executing widget.

The image display screen manager 400 manages the 3D plant image display screen 130, displays an image of a 3D plant selected through the 3D plant selection widget, displays a position of a leakage source selected through the leakage source designation widget, displays a position of a candidate detector selected through the candidate detector generation widget, and displays an image of a leakage scenario confirmed through the optimization widget.

The link manager 500 manages integration of information of connected widgets when widget icons displayed on the widget icon display screen 220 of the process manager 200 are linked. In this case, a link between widget icons is made such that, when a widget icon on the widget icon display screen 220 is clicked and connected to another widget icon, a link line 510 is formed between the widget icons and the link is made.

The 3D plant image manager 600, when a 3D plant selection widget icon 610 displayed on the widget icon display screen 220 of the process manager 200 is selected, displays a related menu of the 3D plant selection widget on the detailed setting manager 300, and when a 3D plant file is selected through a file loading item 620 among the related menu, displays a selected 3D plant image on a separate rescaling window 630, and when the selection of the 3D plant image displayed on the rescaling window 630 is completed, displays the selection-completed 3D plant image on the 3D plant image display screen 130 of the 3D plant image manager 600. In this case, the 3D plant image includes a plant in which tanks storing chemical substances, pipes connected to the tanks, valves, and the like are included, installation spaces, etc, such as entrances, ventilators, and vent holes, and the like. Accordingly, while confirming the 3D plant image displayed on the rescaling window 630, the shape of the plant including the tanks, pipes, and valves storing chemical substances and the installation space where the plant is positioned may be confirmed through the screen.

Meanwhile, the rescaling window 630 converts the 3D plant image displayed through loading so as to be suitable for a standard displayed on the 3D plant image display screen 130. The rescaling window 630 includes a 3D image display screen on which a 3D plant image is displayed, a rotation menu for rotating the 3D image in X, Y, and Z directions, a scale change menu for changing a scale of the 3D image, and a completion menu for applying the 3D image displayed on the 3D image display screen to be displayed on the 3D plant image display screen 130. By using such a rescaling window 630, when a 3D image is displayed on the 3D image display screen, a user may confirm the 3D image by rotating the 3D image using drag or the rotation menu, or by changing the scale of the 3D image using the scale change menu, and when the completion menu is selected, a final 3D image may be applied to the 3D plant image display screen 130.

The chemical substance selection manager 700, when a chemical substance selection widget icon 710 displayed on the widget icon display screen 220 of the process manager 200 is selected, displays a related menu of the chemical substance selection widget on the detailed setting manager 300, and when a chemical substance registered is selected through a search menu of a physical property value item 720 among the related menu, stores and manages physical property information of the selected chemical substance. In this case, when a user links a chemical substance selection widget icon 710 displayed on the widget icon display screen 220 of the process manager 200 to a 3D plant selection widget icon 610, the information of the selected chemical substance is recognized as a chemical substance used in the 3D plant.

The leakage source designation manager 800, when a leakage source designation widget icon 810 displayed on the widget icon display screen 220 of the process manager 200 is selected, displays a related menu of the leakage source designation widget on the detailed setting manager 300, and when a mouse is clicked on the 3D plant image displayed on the 3D plant image display screen 130 of the 3D plant image manager 600, displays a leakage source mark 820 at the clicked point, and inputs a coordinate(s) corresponding to the leakage source mark 820 into a leakage source coordinate item 830 of the related menu. By means of such a leakage source designation manager 800, the leakage source mark 820 may be directly displayed on connection portions of tanks having a leakage possibility, connection portions between tanks and pipes, flanges, valves, and the like, by using enlargement of the 3D plant image, etc.

In addition, the leakage source designation manager 800 receives, as input, a leakage rate applied to the leakage rate item 840 matched with the leakage source coordinate from a user, or displays a leakage rate calculated from a leakage amount calculation window 860 displayed when a leakage rate batch-application item 850 is selected. In this case, the leakage amount calculation window 860 displays leakage type selection items 861 for container leakage and pipe leakage, material-phase selection items 862 including gas and liquid, etc., unit selection items 863 including MKS and FPS, etc., and parameter input items 864 including operating pressure, operating temperature, atmospheric pressure around a discharge port, diameter, discharge coefficient, specific heat ratio, and molecular weight, etc., which are input by a user, and when each item is input, the leakage rate is automatically calculated. Meanwhile, when a chemical substance selection widget icon 710 and a leakage source designation widget icon 810 displayed on the widget icon display screen 220 of the process manager 200 are linked, chemical substance information of the chemical substance selection widget is delivered to a leakage source generation unit, so that a leakage rate of the chemical substance is calculated.

The candidate detector installation manager 900, when a candidate detector generation widget icon 910 displayed on the widget icon display screen 220 of the process manager 200 is selected, displays a related menu of the candidate detector generation widget on the detailed setting manager 300, and when a mouse is clicked on the 3D plant image displayed on the 3D plant image display screen 130 of the 3D plant image manager 600, displays a candidate detector at the clicked point, and inputs a coordinate(s) of the generated candidate detector into a candidate detector coordinate item 920 of the related menu. In addition, when a uniform generation item 930 of the related menu is selected and spacing information of X, Y, and Z coordinates is input, and then a batch generation item 940 is selected, candidate detector coordinates are automatically generated at uniform intervals. In addition, the display of the candidate detector generated and displayed on the screen may be made not to be displayed on the screen by selecting a candidate detector hiding item 950. In this case, when a user links a candidate detector generation widget displayed on the widget icon display screen 220 of the process manager 200 to a 3D plant selection widget icon 610, coordinate information of the generated candidate detector is matched with the 3D plant image. By means of such a candidate detector installation manager 900, a user may directly display the position of a candidate detector by using enlargement of the 3D plant image, etc.

The detector optimization manager 1000, when an optimization executing widget icon 1010 displayed on the widget icon display screen 220 of the process manager 200 is selected and displayed, displays a related menu of the optimization executing widget on the detailed setting manager 300, executes optimization of a detector so as to correspond to an item selected from the related menu, and displays an optimal-position detector and an image of leakage of a chemical substance leaked from a leakage source on a 3D plant image displayed on the 3D plant image display screen 130 of the 3D plant image manager 600. In this case, optimization of a detector installation position may be basically performed by using a turbulence flow model, based on a movement path and a distribution map of a chemical substance diffused after leakage, using physical property information of the chemical substance selected from the chemical substance selection manager 700 and input items of the leakage amount calculation window 860 of the leakage source designation manager 800, and large eddy simulation (LES) or similar techniques may be employed for simulating the diffusion behavior of the leaked chemical substance.

The related menu of the optimization executing widget includes an optimization executing item 1020, an animation executing item 1030, a detector/gas cloud visualization selection item 1040, a scenario selection item 1050, a detector coordinate-detection scenario display item 1060 in which a scenario of a chemical substance detected by a detector is matched with detector coordinates, and the like.

When the optimization executing item 1020 is selected, optimization of a detector applied to the 3D plant is executed among the candidate detectors selected from the candidate detector installation manager 900, and a detector is calculated and selected, and the selected detector is displayed on the 3D plant image.

When the animation executing item 1030 is selected, on the 3D plant image on which the optimized detector is displayed, a flow in which a chemical substance is leaked and diffused is displayed as an image. Accordingly, a flow of a chemical substance leaked from entire leakage sources is displayed as an image so that a user may confirm the flow.

When a detector is selected in a detector/gas cloud visualization selection item 1040, the detector is displayed on the 3D plant image, and when the detector is not selected, the detector is not displayed on the 3D plant image. In addition, when a gas cloud is selected, an image of leakage of a chemical substance is displayed on the 3D plant image, and when a gas cloud is not selected, an image of leakage of a chemical substance is not displayed on the 3D plant image.

In addition, when a scenario applied to the detector is selected in a scenario selection item 1050, an image of leakage of a chemical substance applied to the detector is displayed on the 3D plant image, and when the scenario is not selected, the image of leakage of a chemical substance applied to the detector is not displayed on the 3D plant image.

In addition, when a detector coordinate is selected in a detector coordinate-detection scenario display item 1060, a scenario image of a chemical substance matched with the selected detector coordinate is displayed in different colors on the 3D plant image. Accordingly, a user may confirm a flow of a chemical substance influencing the selected detector.

A method for simulating an optimized installation position of a detector of a chemical substance plant by using the simulation apparatus according to the present invention is as follows.

First, a process of displaying a 3D plant image on the 3D image display screen 130 may be performed. The 3D plant selection widget icon 610 displayed on the widget icon display screen 220 of a process manager 200 is selected to display a related menu of the 3D plant selection widget on the detailed setting manager 300, and a 3D plant file is selected through the file loading item 620 among the related menu, and the selected 3D plant image is displayed on a separate rescaling window 630, and when selection of the 3D plant image displayed on the rescaling window 630 is completed, the selection-completed 3D plant image may be displayed on the 3D plant image display screen 130 of the 3D plant image manager 600.

Next, a process of displaying a leakage source mark 820 by clicking a leakage source position on the 3D plant image may be performed. When a mouse is clicked on the 3D plant image displayed on the 3D plant image display screen 130 of the 3D plant image manager 600, a process of displaying a leakage source mark 820 at a clicked point may be performed.

Next, a process of displaying candidate detectors at uniform intervals on the 3D plant image may be performed. When a candidate detector generation widget icon 910 displayed on the widget icon display screen 220 of the process manager 200 is selected, a related menu of the candidate detector generation widget is displayed on the detailed setting manager 300, and when a mouse is clicked on the 3D plant image displayed on the 3D plant image display screen 130 of the 3D plant image manager 600, a candidate detector may be displayed at a clicked point. When the candidate detector is displayed, a coordinate(s) of the generated candidate detector are input into a candidate detector coordinate item 920 of the related menu, and when a uniform generation item 930 of the related menu is selected, and spacing information of X, Y, and Z coordinates is input, and then a batch generation item 940 is selected, candidate detector coordinates may be automatically generated at uniform intervals.

Next, a process of calculating an optimal-position detector among the candidate detectors based on a movement path and a distribution map of a chemical substance leaked from a leakage source may be performed. When an optimization executing widget icon 1010 displayed on the widget icon display screen 220 of the process manager 200 is selected and displayed, a detector optimization manager 1000 displays a related menu of the optimization executing widget on the detailed setting manager 300, and may execute optimization of a detector so as to correspond to an item selected from the related menu. In this case, optimization of a detector installation position may be basically performed by using a turbulence flow model, based on a movement path and a distribution map of a chemical substance diffused after leakage, using physical property information of the chemical substance selected from the chemical substance selection manager 700 and input items of the leakage amount calculation window 860 of the leakage source designation manager 800, and large eddy simulation (LES) or similar techniques may be employed for simulating the diffusion behavior of the leaked chemical substance.

Next, a process of displaying an optimal-position detector on the 3D plant image may be performed. The optimization manager 1000 may execute optimization of a detector, and may display an optimal-position detector and an image of leakage of a chemical substance leaked from a leakage source on a 3D plant image displayed on the 3D plant image display screen 130 of the 3D plant image manager 600.

The present invention has been described with reference to the limited embodiments and the drawings, but the present invention is not limited thereto. The described embodiments may be changed or modified by those skilled in the art to which the present invention pertains within the technical spirit of the present invention and within the scope equivalent to the appended claims.

DESCRIPTION OF REFERENCE NUMERALS

100: a screen manager
200: a process manager
300: a detailed setting manager
400: an image display screen manager
500: a link manager
600: a 3D plant image manager
700: a chemical substance selection manager
800: a leakage source designation manager
900: a candidate detector installation manager
1000: a detector optimization manager

What is claimed is:

1. A simulation apparatus for confirming an optimized installation position of a detector of a chemical substance plant, the simulation apparatus comprising:
- a screen manager comprising:
  - a process display screen for displaying widgets used for simulation of a chemical substance plant that are selected by a user on a widget icon display screen and for displaying a link line when widgets are linked to each other,
  - a detailed setting display screen for displaying a related menu of a selected widget, and
  - a 3D plant image display screen for displaying a 3D plant image;
- a process manager, configured to manage the process display screen and comprising:
  - a widget list display portion in which a list of widgets is displayed, and
  - the widget icon display screen for displaying, as an icon, a widget selected from the widget list display portion;
- a detailed setting manager configured to display a related menu of a selected widget when a widget icon is selected;
- an image display screen manager configured to:
  - display an image of a 3D plant,
  - display a position of a leakage source, and
  - display a position of a candidate detector, and to display an image of a leakage scenario;
- a link manager configured to manage integration of information of the connected widgets when widget icons are linked;
- a 3D plant image manager configured to display a 3D plant image on the 3D plant image display screen;
- a chemical substance selection manager configured to store and manage physical property information of a chemical substance;
- a leakage source designation manager configured to:
  - when a mouse is clicked on the 3D plant image displayed on the 3D plant image display screen,
  - display a leakage source mark at a clicked point, and
  - input coordinates corresponding to the leakage source mark into a leakage source coordinate item;
- a candidate detector installation manager configured to:
  - when a mouse is clicked on the 3D plant image,
  - display a candidate detector at a clicked point, and
  - input coordinates of a generated candidate detector into a candidate detector coordinate item; and
- a detector optimization manager configured to display an optimal-position detector and an image of leakage of a chemical substance leaked from a leakage source on the 3D plant image, wherein the optimization manager executes optimization of a detector based on a movement path and a distribution map of a chemical substance diffused after leakage from a leakage source, calculates an optimal-position detector among candidate detectors, and displays the optimal-position detector on the 3D plant image.

2. The simulation apparatus of claim 1, wherein the process manager includes a 3D plant selection widget, a chemical substance selection widget, a leakage source designation widget, a candidate detector generation widget, and an optimization widget.

3. The simulation apparatus of claim 2, wherein the process manager, when a widget displayed on the widget list display portion is selected by a mouse and then dragged to the widget icon display screen, displays a widget icon on the widget icon display screen, and wherein the widget icon displayed on the widget icon display screen is movable in upward, downward, leftward, and rightward directions by using the mouse.

4. The simulation apparatus of claim 3, wherein widget link connection portions, capable of linking other widget icons, are formed at upper, lower, left, and right sides of the widget icon.

5. The simulation apparatus of claim 2, wherein a related menu of an optimization executing widget of the detector optimization manager includes an optimization executing item, an animation executing item, a detector/gas cloud visualization selection item, a scenario selection item, and a detector coordinate-detection scenario display item in which a scenario of a chemical substance detected by a detector is matched with detector coordinates.

6. The simulation apparatus of claim 5, wherein, when the optimization executing item is selected, optimization of a detector applied to a 3D plant is executed, among candidate detectors selected from the candidate detector installation manager, a detector is calculated and selected, and the selected detector is displayed on a 3D plant image;

when an animation executing item is selected, a flow in which a chemical substance is leaked and diffused is displayed as an image on the 3D plant image on which the optimized detector is displayed;

when a detector is selected in a detector/gas cloud visualization selection item, the detector is displayed on the 3D plant image, and when the detector is not selected, the detector is not displayed on the 3D plant image;

when a gas cloud is selected, an image of leakage of a chemical substance is displayed on the 3D plant image, and when the gas cloud is not selected, the image of leakage of a chemical substance is not displayed on the 3D plant image;

when a scenario applied to a detector is selected in the scenario selection item, an image of leakage of a chemical substance applied to the detector is displayed on the 3D plant image, and when the scenario is not selected, the image of leakage of a chemical substance applied to the detector is not displayed on the 3D plant image; and when a detector coordinate is selected in the detector coordinate-detection scenario display item, a scenario image of a chemical substance matched with the selected detector coordinate is displayed in different colors on the 3D plant image.

7. The simulation apparatus of claim 2, wherein the link manager, when a widget icon is connected to another widget icon while the widget icon is clicked by a mouse, forms a link line between the widget icons.

8. The simulation apparatus of claim 2, wherein a 3D plant image management unit:

when a 3D plant selection widget icon displayed on the widget icon display screen of the process manager is selected, displays a related menu of a 3D plant selection widget on the detailed setting manager;

when a 3D plant file is selected through a file loading item among the related menu, displays a selected 3D plant image on a separate rescaling window; and when selection of the 3D plant image displayed on the rescaling window is completed, displays the selection-completed 3D plant image on the 3D plant image display screen.

9. The simulation apparatus of claim 8, wherein the rescaling window converts the 3D plant image displayed through loading to be suitable for a standard displayed on the 3D plant image display screen, and wherein the rescaling window includes:

a 3D image display screen on which a 3D plant image is displayed;

a rotation menu for rotating a 3D image in X, Y, and Z directions;

a scale change menu for changing a scale of the 3D image; and a completion menu for applying the 3D image displayed on the 3D image display screen to be displayed on the 3D plant image display screen.

10. The simulation apparatus of claim 2, wherein the leakage source designation manager:

receives, as input, from a user, an applied leakage rate of a leakage rate item matched with a leakage source coordinate; or when a leakage rate batch-application item is selected, displays a leakage rate calculated from a leakage amount calculation window displayed.

11. The simulation apparatus of claim 10, wherein the leakage amount calculation window displays leakage type selection items including container leakage and pipe leakage, material-phase selection items including gas and liquid, unit selection items including MKS and FPS, and parameter input items including operating pressure, operating temperature, atmospheric pressure around a discharge port, diameter, discharge coefficient, specific heat ratio, and molecular weight, which are input by a user, and wherein a leakage rate is automatically calculated when each item is input.

12. The simulation apparatus of claim 11, wherein, when a chemical substance selection widget and a leakage source designation widget are linked, chemical substance information of the chemical substance selection widget is delivered to the leakage source designation manager, so that a leakage rate for the chemical substance is calculated.

13. The simulation apparatus of claim 2, wherein the candidate detector installation manager, when a uniform generation item of a related menu is selected and spacing information of X, Y, and Z coordinates is input, and then a batch generation item is selected, automatically generates candidate detector coordinates at uniform intervals.

14. The simulation apparatus of claim 13, wherein the candidate detector installation manager is configured to set display of a candidate detector generated and displayed on a screen so as not to be displayed on the screen by selecting a candidate detector hiding item.

15. The simulation apparatus of claim 1, wherein, based on a movement path and a distribution map of a chemical substance diffused after leakage, using physical property information of the chemical substance selected from the chemical substance selection manager and input items of a leakage amount calculation window of the leakage source designation manager, optimization of a detector installation position of the detector optimization manager is basically performed by using a turbulence flow, and a large eddy simulation (LES) technique is employed.

16. A method for simulating an optimized installation position of a detector of a chemical substance plant using the simulation apparatus according to claim 1, the method comprising:

displaying a 3D plant image on a 3D image display screen;

displaying a leakage source mark by clicking a leakage source position on the 3D plant image;

displaying candidate detectors at uniform intervals on the 3D plant image;

calculating an optimal-position detector among the candidate detectors based on a movement path and a distribution map of a chemical substance leaked from a leakage source; and displaying the optimal-position detector on the 3D plant image.

17. A simulation apparatus for confirming an optimized installation position of a detector of a chemical substance plant, the simulation apparatus comprising:

a screen manager comprising:

a process display screen for:

displaying widgets used for simulation of a chemical substance plant to allow selection of the widgets by a user, displaying a widget selected by the user on a widget icon display screen, and displaying a link line when links are made between widgets displayed in a widget icon display area, a detailed setting display screen for displaying a related menu of a selected widget when a widget icon in a widget icon display area of a process management region is selected, and a 3D plant image display screen for displaying a 3D plant image selected through a 3D plant selection widget of a process manager;

the process manager configured to manage the process display screen, and comprising:

a widget list display portion for displaying a list of widgets including a 3D plant selection widget, a chemical substance selection widget, a leakage source designation widget, a candidate detector generation widget, and an optimization widget, and the widget icon display screen for displaying, as an icon, a widget selected from the widget list display portion;

a detailed setting manager configured to manage the detailed setting display screen, and to display a related menu of a selected widget when a widget icon positioned on the widget icon display screen of the process manager is selected;

an image display screen manager configured to:

manage a 3D plant image display screen, display an image of a 3D plant selected through a 3D plant selection widget, display a position of a leakage source selected through a leakage source designation widget, display a position of a detector candidate selected through a candidate detector generation widget, and display an image of a leakage scenario confirmed through an optimization widget;

a link manager configured to manage integration of information of connected widgets when widget icons displayed on the widget icon display screen of the process manager are linked;

a 3D plant image manager configured to:

when a 3D plant selection widget icon displayed on the widget icon display screen of the process manager is selected, display a related menu of the 3D plant selection widget on the detailed setting manager, when a 3D plant file is selected through a file loading item among the related menu, display a selected 3D plant image in a separate rescaling window, and when selection of the 3D plant image displayed in the rescaling window is completed, display the selected 3D plant image on the 3D plant image display screen of the 3D plant image manager;

a chemical substance selection manager configured to:

when a chemical substance selection widget icon displayed on the widget icon display screen of the process manager is selected, display a related menu of the chemical substance selection widget on the detailed setting manager, and when a registered chemical substance is selected through a search menu of a physical property value item among the related menu, store and manage physical property information of the selected chemical substance;

a leakage source designation manager configured to:

when a leakage source designation widget icon displayed on the widget icon display screen of the process manager is selected, display a related menu of the leakage source designation widget on the detailed setting manager, and when a 3D plant image displayed on the 3D plant image display screen of the 3D plant image manager is clicked with a mouse, display a leakage source mark at a clicked point, and input, into a leakage source coordinate item of the related menu, a coordinate corresponding to the leakage source mark;

a candidate detector installation manager configured to:

when a candidate detector generation widget icon displayed on the widget icon display screen of the process manager is selected, display a related menu of the candidate detector generation widget on the detailed setting manager, and when a 3D plant image displayed on the 3D plant image display screen of the 3D plant image manager is clicked with a mouse, display a candidate detector at a clicked point, and input, into a candidate detector coordinate item of the related menu, a coordinate of the generated candidate detector; and a detector optimization manager configured to:

when an optimization executing widget icon displayed on the widget icon display screen of the process manager is selected and displayed, display a related menu of the optimization executing widget on the detailed setting manager, execute optimization of a detector so as to correspond an item selected from the related menu, and display, on a 3D plant image displayed on the 3D plant image display screen of the 3D plant image manager, an optimal-position detector and an image of leakage of a chemical substance leaked from a leakage source.

* * * * *